United States Patent
Wang

(10) Patent No.: US 12,490,575 B2
(45) Date of Patent: Dec. 2, 2025

(54) DISPLAY PANEL, MANUFACTURING METHOD THEREOF AND DISPLAY DEVICE

(71) Applicants: Beijing BOE Technology Development Co., Ltd., Beijing (CN); BOE TECHNOLOGY GROUP CO., LTD., Beijing (CN)

(72) Inventor: Haowei Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 102 days.

(21) Appl. No.: 17/795,195

(22) PCT Filed: Aug. 27, 2021

(86) PCT No.: PCT/CN2021/114935
§ 371 (c)(1),
(2) Date: Jul. 25, 2022

(87) PCT Pub. No.: WO2023/024059
PCT Pub. Date: Mar. 2, 2023

(65) Prior Publication Data
US 2024/0215282 A1    Jun. 27, 2024

(51) Int. Cl.
*H10K 50/115*    (2023.01)
*H10K 59/12*    (2023.01)
(Continued)

(52) U.S. Cl.
CPC ....... *H10K 50/115* (2023.02); *H10K 59/1201* (2023.02); *H10K 59/122* (2023.02); *H10K 71/60* (2023.02)

(58) Field of Classification Search
CPC ............. H10K 50/115; H10K 59/1201; H10K 59/122; H10K 71/60; H10K 71/00;
(Continued)

(56) References Cited

U.S. PATENT DOCUMENTS 5,537,000 A * 7/1996 Alivisatos .............. B82Y 30/00
313/499
7,651,674 B2 * 1/2010 Jun ....................... C09K 11/565
977/773
(Continued)

FOREIGN PATENT DOCUMENTS

CN    105301827 A    2/2016
CN    112234155 A    1/2021
(Continued)

*Primary Examiner* — Caleb E Henry
(74) *Attorney, Agent, or Firm* — HOUTTEMAN LAW LLC

(57) ABSTRACT

A method for manufacturing display panel including: forming pixel defining layer on one side of base substrate; forming quantum dot layer, including sequentially forming first quantum dot pattern of at least two quantum dot patterns, forming first quantum dot pattern of one quantum dot pattern including forming quantum dot film capable of emitting light with corresponding colors, quantum dot film including quantum dot body and cross-linkable ligand; performing local cross-linking process on quantum dot film; performing developing process on quantum dot film subjected to local crosslinking process to form first quantum dot pattern in pixel accommodating hole corresponding to corresponding color; after forming first quantum dot pattern of quantum dot patterns, the method includes performing fluorescence property quenching process to quench fluorescence of quantum dot body in quantum dot on surface of first quantum dot pattern and not subjected to crosslinking process. Also provided is display panel and display device.

20 Claims, 8 Drawing Sheets

(51) Int. Cl.
  *H10K 59/122* (2023.01)
  *H10K 71/60* (2023.01)
(58) Field of Classification Search
  CPC .... H10K 59/35; H10K 59/352; H10K 50/155;
      H10K 50/165; H10K 50/15; H10K 50/16;
      H10K 59/353; H10K 59/12; H10K 59/38;
      H10K 50/14; H10K 71/13; H10K
      2101/00; H10K 2102/00; G02F 1/1335;
      H01L 2251/55; H01L 51/56; H01L
      2251/303; H01L 51/5072; H01L 51/5056;
      H01L 51/5048; H01L 51/502; H01L
      51/0004; H01L 27/3246; H01L 27/3244
  See application file for complete search history.

(56) References Cited

U.S. PATENT DOCUMENTS

| | | | | |
|---|---|---|---|---|
| 7,910,400 | B2* | 3/2011 | Kwon | H10K 50/115 |
| | | | | 257/E21.007 |
| 9,768,404 | B1* | 9/2017 | Steckel | H10D 86/423 |
| 9,812,004 | B1* | 11/2017 | Boshernitzan | G08C 17/02 |
| 9,831,706 | B2* | 11/2017 | MacWilliams | H02J 7/32 |
| 9,874,693 | B2* | 1/2018 | Baiocco | G02B 6/12004 |
| 10,394,378 | B2* | 8/2019 | Huang | G06F 3/0412 |
| 10,826,011 | B1* | 11/2020 | Angioni | H10K 59/122 |
| 11,700,753 | B2* | 7/2023 | Kim | H10K 50/115 |
| 2006/0039850 | A1* | 2/2006 | Jun | C09K 11/08 |
| | | | | 423/561.1 |
| 2010/0140586 | A1* | 6/2010 | Char | C01G 11/00 |
| | | | | 257/14 |
| 2012/0280345 | A1* | 11/2012 | Zhu | G02B 6/1226 |
| | | | | 257/E31.127 |
| 2013/0009131 | A1* | 1/2013 | Kazlas | H10K 50/171 |
| | | | | 257/13 |
| 2013/0037778 | A1* | 2/2013 | Kazlas | H10H 20/01 |
| | | | | 257/E29.024 |
| 2014/0027816 | A1* | 1/2014 | Cea | H10D 62/822 |
| | | | | 257/E29.085 |
| 2014/0197507 | A1* | 7/2014 | Assefa | H10F 39/807 |
| | | | | 438/69 |
| 2015/0091093 | A1* | 4/2015 | Bouche | H10D 64/62 |
| | | | | 257/369 |
| 2015/0268417 | A1* | 9/2015 | Assefa | G02B 6/4257 |
| | | | | 385/14 |
| 2016/0027848 | A1* | 1/2016 | Liu | H10D 86/60 |
| | | | | 257/40 |
| 2016/0240590 | A1* | 8/2016 | Liu | H10K 50/16 |
| 2016/0248029 | A1* | 8/2016 | Liu | C09K 11/59 |
| 2017/0115823 | A1* | 4/2017 | Huang | G06F 3/0421 |
| 2017/0221969 | A1* | 8/2017 | Steckel | H10K 59/32 |
| 2017/0256685 | A1* | 9/2017 | Schug | F21V 9/30 |
| 2018/0019371 | A1* | 1/2018 | Steckel | C09K 11/883 |
| 2018/0053907 | A1* | 2/2018 | He | H10K 71/00 |
| 2018/0204987 | A1* | 7/2018 | Li | H10H 20/84 |
| 2018/0254421 | A1* | 9/2018 | Kinge | H10K 50/15 |
| 2018/0309078 | A1* | 10/2018 | Ju | H10K 50/15 |
| 2018/0351125 | A1* | 12/2018 | He | H10K 71/12 |
| 2018/0366672 | A1* | 12/2018 | Wang | H10K 71/15 |
| 2019/0296264 | A1* | 9/2019 | Mathai | H10K 50/15 |
| 2019/0371864 | A1* | 12/2019 | Kim | H10K 71/00 |
| 2020/0185462 | A1* | 6/2020 | Lee | H10K 59/352 |
| 2020/0203650 | A1* | 6/2020 | Kim | H10K 50/16 |
| 2021/0028385 | A1* | 1/2021 | Sakakibara | H05B 33/10 |
| 2021/0151629 | A1* | 5/2021 | Boardman | H10H 20/813 |
| 2021/0408416 | A1* | 12/2021 | Angioni | H10K 50/15 |
| 2021/0408417 | A1* | 12/2021 | Angioni | H10K 50/15 |
| 2022/0013744 | A1* | 1/2022 | Sakakibara | H10K 50/115 |
| 2022/0123060 | A1* | 4/2022 | Kang | H10K 59/35 |
| 2022/0127527 | A1* | 4/2022 | Zhang | H10K 59/35 |

FOREIGN PATENT DOCUMENTS

| | | |
|---|---|---|
| CN | 112271269 A | 1/2021 |
| KR | 20110053016 A | 5/2011 |

* cited by examiner

DISPLAY PANEL, MANUFACTURING METHOD THEREOF AND DISPLAY DEVICE

TECHNICAL FIELD

The disclosure relates to the field of display, and particularly relates to a display panel, a manufacturing method thereof and a display device.

BACKGROUND

Quantum dots are an important fluorescent nanomaterial. In the field of display, quantum dots are attracting more and more attention as materials of light emitting layers of display devices. With the development of technology, the resolution of the display device is required to be higher and higher by users.

Therefore, how to manufacture quantum dot display device having a high-resolution becomes a hot spot of research.

Patterning the quantum dot material film to achieve high resolution of the display device is a feasible method, but a color mixing problem exists in the patterning process of the quantum dot material film, which affects the display effect of the display device.

SUMMARY

In a first aspect, an embodiment of the present disclosure provides a method for manufacturing a display panel, the method includes:
  providing a base substrate;
  forming a pixel defining layer on one side of the base substrate, the pixel defining layer comprising a plurality of pixel accommodating holes;
  forming a quantum dot layer, the quantum dot layer comprising at least two quantum dot pattern elements capable of emitting light with different colors, and a first quantum dot pattern being in one-to-one correspondence with the plurality of pixel accommodating holes and positioned in a corresponding one of the pixel accommodating holes;
  wherein the forming of the quantum dot layer comprises sequentially forming the first quantum dot pattern of the at least two quantum dot pattern elements, and the forming of the first quantum dot pattern of one of the at least two quantum dot pattern elements comprises:
  forming a quantum dot film capable of emitting light of a corresponding color, the quantum dot film comprising quantum dot bodies and cross-linkable ligands,
  performing a local cross-linking process on the quantum dot film such that cross-linkable ligands of the quantum dot film positioned in the pixel accommodating holes corresponding to the corresponding color are cross-linked, and
  performing a developing process on the quantum dot film subjected to the local cross-linking process so as to form the first quantum dot pattern in the pixel accommodating holes corresponding to the corresponding color;
  wherein after the sequentially forming the first quantum dot pattern of the at least two quantum dot pattern elements, the method further comprises:
  performing fluorescence property quenching process such that a fluorescence property of a quantum dot body in a quantum dot which is positioned on a surface of the first quantum dot pattern and not subjected to the cross-linking process is quenched to form the at least two quantum dot pattern elements, wherein a part of the quantum dot pattern elements comprises the first quantum dot pattern and a second quantum dot pattern which are stacked, the second quantum dot pattern is positioned on a side of the first quantum dot pattern far away from the base substrate, the first quantum dot pattern comprises the quantum dot body with fluorescence property and a crosslinking structure, and the second quantum dot pattern comprises a quantum dot body with fluorescence property quenching and uncross-linked cross-linkable ligands.

In some embodiments, the performing of the fluorescence property quenching processing includes:
  performing, by using a processing solution with metal cations, an ion exchange process on the quantum dot body in the quantum dot which is positioned on the surface of the first quantum dot pattern and is not subjected to the cross-linking process.

In some embodiments, the performing of the ion exchange process on the quantum dot body in the quantum dot which is positioned on the surface of the first quantum dot pattern and is not subjected to the cross-linking processing by using the processing solution with metal cations includes:
  immersing the display panel in the processing solution with metal cations, a concentration of the metal cations in the processing solution is 0.05 mol/L to 0.15 mol/L, and an immersion time is 5 min to 15 min.

In some embodiments, the metal cations are selected from at least one of $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$ and $Pb^{2+}$.

In some embodiments, the cross-linkable ligands are photo cross-linkable ligands, and the performing of the local cross-linking process on the quantum dot film includes:
  disposing a mask plate on one side of the quantum dot film far away from the base substrate, wherein the mask plate comprises a light-transmitting portion and a light-shielding portion, and the mask plate directly faces the pixel accommodating holes corresponding to the corresponding color; and
  exposing the pixel accommodating holes corresponding to the corresponding color by using the mask plate so as to enable the cross-linkable ligands positioned in the pixel accommodating holes corresponding to the corresponding color on the quantum dot film to be cross-linked.

In some embodiments, during the local cross-linking process of the quantum dot film, the cross-linkable ligands after being cross-linked form a cross-linked network structure on the surface of the quantum dot body.

In some embodiments, before the forming of the pixel defining layer on one side of the base substrate, the method further includes forming a first electrode on the base substrate;
  after the forming of the quantum dot layer, the method further includes forming a second electrode on one side of the quantum dot layer far away from the base substrate.

In some embodiments, the first electrode is a cathode and the second electrode is an anode;
  after forming the first electrode and before forming the pixel defining layer, the method further includes:
  forming an electron transmission layer on one side of the first electrode far away from the base substrate.

In some embodiments, after forming the quantum dot layer and before forming the second electrode, the method further includes:

sequentially forming a hole transport layer and a hole injection layer on one side of the quantum dot layer far away from the base substrate.

In some embodiments, after forming the second electrode, the method further includes:

forming an encapsulation layer on one side of the second electrode far away from the base substrate.

In a second aspect, an embodiment of the present disclosure further provide a display panel, including:

a base substrate;

a pixel defining layer located on the base substrate and including a plurality of pixel accommodating holes;

a quantum dot layer including at least two quantum dot pattern elements capable of emitting light of different colors, the at least two quantum dot pattern elements being in one-to-one correspondence with the plurality of pixel accommodating holes and located in the corresponding pixel accommodating holes, wherein a part of the at least two quantum dot patterns include a first quantum dot pattern and a second quantum dot pattern which are stacked, the second quantum dot pattern is located on one side surface of the first quantum dot pattern far away from the base substrate, the first quantum dot pattern includes a quantum dot body with fluorescence property and a cross-linking structure, and the second quantum dot pattern includes a quantum dot body with fluorescence property quenching and an uncross-linked cross-linking ligand.

In some embodiments, the first quantum dot pattern is in direct contact with the second quantum dot pattern.

In some embodiments, a material of a quantum dot core in the quantum dot body with fluorescence property quenching and/or a material of a quantum dot shell in the quantum dot body with fluorescence property quenching includes at least one of $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, $Pb^{2+}$.

In some embodiments, the cross-linked structure is a cross-linked network structure.

In some embodiments, the display panel is a quantum dot light emitting diode display panel, the display panel further includes:

a first electrode located between the base substrate and the quantum dot layer; and a second electrode positioned on one side of the quantum dot layer far away from the base substrate.

In some embodiments, the first electrode is a cathode and the second electrode is an anode, the display panel further includes:

an electron transport layer between the first electrode and the quantum dot layer;

a hole transport layer between the quantum dot layer and the second electrode; and a hole injection layer between the hole transport layer and the second electrode.

In some embodiments, the display panel includes a color conversion layer and a light source, the color conversion layer being the quantum dot layer.

In a third aspect, an embodiment of the present disclosure further provides a display device, including the display panel as provided in the second aspect above.

DETAIL DESCRIPTION OF EMBODIMENTS

In order to make those skilled in the art better understand the technical solution of the present disclosure, a display panel, a manufacturing method thereof, and a display device provided by the present disclosure are described in detail below with reference to the accompanying drawings.

Figure 1:
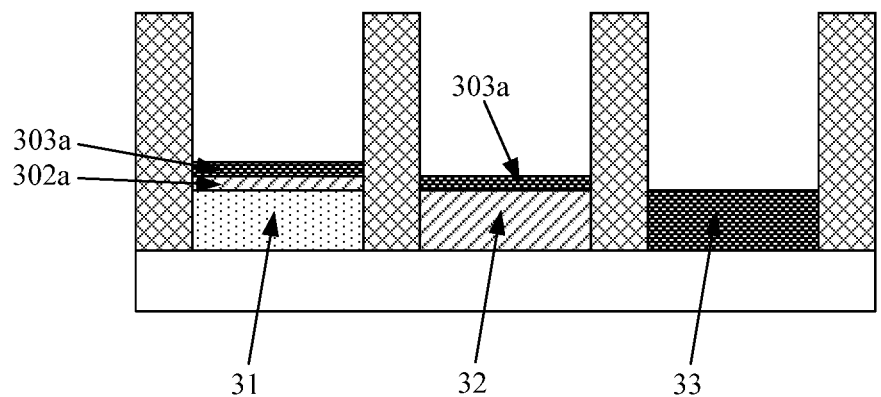
FIG. 1 is a schematic diagram of manufacturing a plurality of quantum dot pattern elements capable of emitting light of different colors by using a direct photolithography process in the related art.

FIG. 1 is a schematic diagram of method for manufacturing a plurality of quantum dot pattern elements capable of emitting light of different colors by using a direct photolithography process in the related art. As shown in FIG. 1, in order to implement color display, a plurality of quantum dot pattern elements capable of emitting light of different colors need to be manufactured in a display panel. The quantum dot pattern elements emitting different colors of light need to be manufactured by corresponding direct lithography processes, respectively.

The display panel is divided into a plurality of sub-pixel regions, and each sub-pixel region is configured with a corresponding light emission color. Taking the case shown in FIG. 1 as an example, the display panel is divided into a red sub-pixel region whose light emission color is red, a green sub-pixel region whose light emission color is green, and a blue sub-pixel region whose light emission color is blue. The red sub-pixel region is provided with a quantum dot pattern element 31 capable of emitting red light, the green sub-pixel region is provided with a quantum dot pattern element 32 capable of emitting green light, and the blue sub-pixel region is provided with a quantum dot pattern element 33 capable of emitting blue light.

In the process of respectively manufacturing the quantum dot pattern element 31, the quantum dot pattern element 32 and the quantum dot pattern element 33, the quantum dots of different types are in direct contact, resulting in the problem that quantum dot residue possibly occurs in the process of performing a direct lithography process. Referring to FIG. 1, taking an example of a sequence of manufacturing a quantum dot pattern element 31 capable of emitting red light, then manufacturing a quantum dot pattern element 32 capable of emitting green light, and finally manufacturing a quantum dot pattern element 33 capable of emitting blue light, green quantum dots 302*a* and blue quantum dots 303*a* remain in the red sub-pixel region, and blue quantum dots 303*a* remain in the green sub-pixel region, that is, there is a color mixing problem, which affects the display color gamut of the display panel.

To effectively improve or even completely solve the above technical problems in the related art, the present disclosure provides a corresponding solution, which will be described in detail below with reference to specific embodiments.

Figure 2:
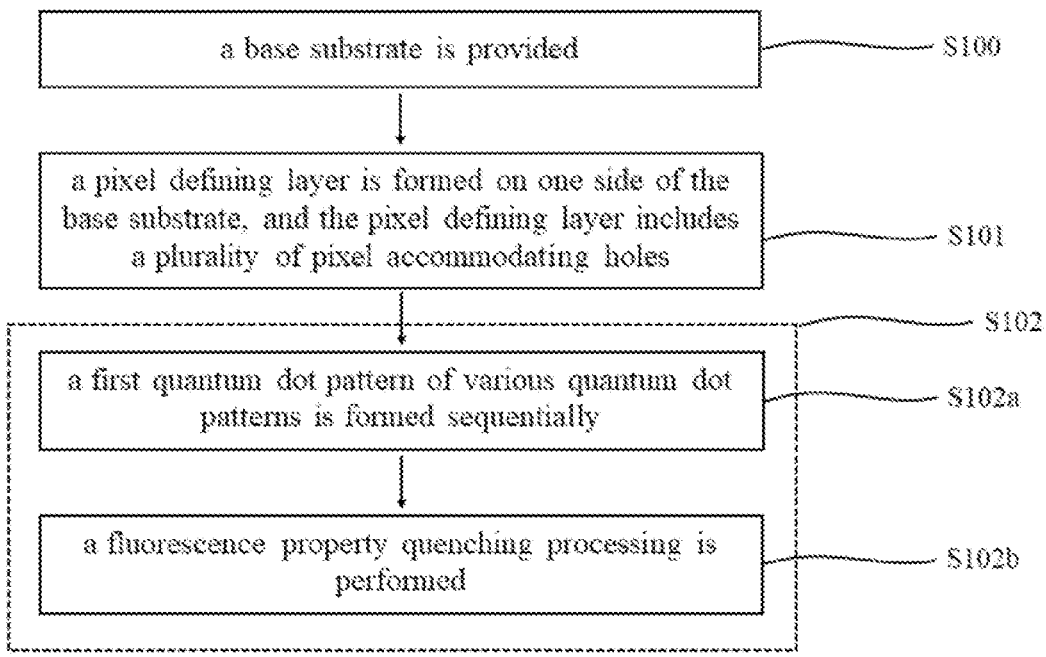
FIG. 2 is a flowchart of a method for manufacturing a display panel according to an embodiment of the disclosure.

FIG. 2 is a flowchart of a method for manufacturing a display panel according to an embodiment of the present disclosure. As shown in FIG. 2, the display panel is a Quantum Dot Light Emitting diode (QLED) display panel, and the method includes the following steps S100 to S102.

At step S100, a base substrate is provided.

The base substrate may be a suitable substrate such as a hard substrate (e.g., a glass substrate) or a flexible substrate (e.g., a resin substrate).

At step S101, a pixel defining layer is formed on one side of the base substrate, and the pixel defining layer includes a plurality of pixel accommodating holes.

At step S102, a quantum dot layer is formed.

The quantum dot layer includes at least two quantum dot pattern elements capable of emitting different color lights, the quantum dot pattern elements and the pixel accommodating holes are in one-to-one correspondence, and the quantum dot pattern elements are located in respective pixel accommodating holes.

The step S102 includes the following step S102*a* and step S102*b*.

The step S102*a* specifically includes: sequentially forming first quantum dot patterns of respective quantum dot pattern elements.

Figure 3:
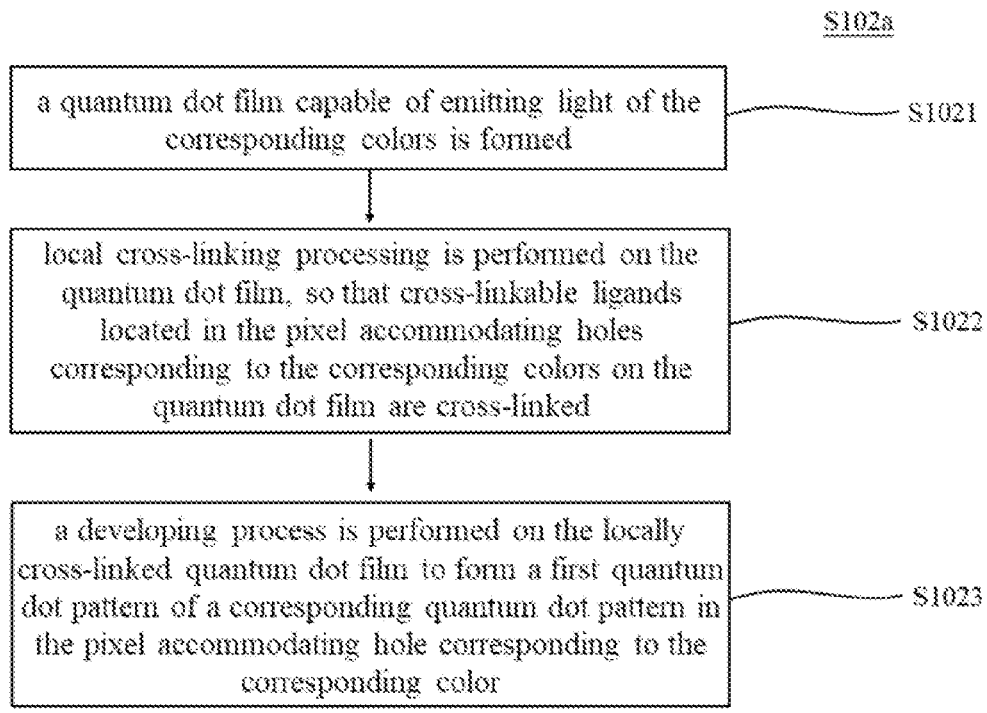
FIG. 3 is a flow chart of a method of forming a first quantum dot pattern of a quantum dot pattern element according to an embodiment of the present disclosure.

FIG. 3 is a flowchart of a method for forming a first quantum dot pattern of a quantum dot pattern element according to an embodiment of the present disclosure. As shown in FIG. 3, the step S102*a* includes the following steps S1021 to S1023.

At step S1021, a quantum dot film capable of emitting light of the corresponding colors is formed.

The quantum dot film includes a plurality of quantum dots, each quantum dot includes a quantum dot body and a cross-linkable ligand, and the cross-linkable ligand is connected with the quantum dot body through a coordination bond.

At step S1022, local cross-linking processing is performed on the quantum dot film, such that cross-linkable ligands of the quantum dot film that are located in the pixel accommodating holes corresponding to a specific color are cross-linked.

At step S1023, a developing process is performed on the quantum dot film subjected to a local cross-linking process to form a first quantum dot pattern of a corresponding quantum dot pattern element in the pixel accommodating hole corresponding to the specific color.

Through the steps S1021 to S1023, a corresponding first quantum dot pattern can be formed in the corresponding pixel accommodating hole. At this time, the material of the manufactured first quantum dot pattern includes the quantum dot body with fluorescent property and the cross-linked structure.

In some embodiments, if the quantum dot layer includes N quantum dot pattern elements emitting different colors of light, the steps S1021 to S1023 may be repeated N times to respectively manufacture the first quantum dot pattern of the N types of quantum dot pattern elements. For example, if the red, green, and blue quantum dot pattern elements shown in FIG. 1 are manufactured, it is necessary to repeatedly perform the above-described steps S1021 to S1023 three times.

Referring again to the description in the related art, in the process of separately manufacturing each red quantum dot pattern element, since different types of quantum dots are in direct contact with each other, it is apt to cause quantum dot residues after a developing process, thereby causing a problem of color mixing.

At step S102*b*, a fluorescence property quenching process is performed.

In the embodiment of the present disclosure, after the manufacturation of the first quantum dot pattern of each quantum dot pattern element is completed through step S102*a*, the fluorescence quenching processing is performed on the manufactured product, so that the fluorescence property of the quantum dot body in the quantum dot located on the surface of the first quantum dot pattern and not subjected to the cross-linking process is quenched and a second quantum dot pattern is formed.

After the step S102*b*, various kinds of quantum dot pattern elements can be obtained. Some of the quantum dot pattern elements include a first quantum dot pattern and a second quantum dot pattern which are stacked and located on one side of the first quantum dot pattern far away from the base substrate, the first quantum dot pattern includes a quantum dot body with fluorescence property and a cross-linked structure, and the second quantum dot pattern includes a quantum dot body with fluorescence property quenching and a cross-linkable ligand which has not been cross-linked.

In the embodiment of the present disclosure, in the process of fluorescence property quenching, the quantum dot body can be effectively surrounded and covered by the cross-linking structure formed by cross-linking the cross-linkable ligand in the first quantum dot pattern (that is, the surface of the quantum dot body is surrounded and covered by the resin shell). In the process of fluorescence property quenching in step S102*b*, the fluorescence property of the quantum dot body surrounded and covered with the cross-linked structure in the first quantum dot pattern are not affected, and therefore, only the fluorescence properties of the quantum dot bodies in the quantum dots, which are on the surface of the first quantum dot pattern and are not subjected to the cross-linking process, are quenched, thereby forming the second quantum dot pattern.

In the embodiment of the present disclosure, through the step S102*b*, the fluorescence of the quantum dot bodies that remain on the surface of the first quantum dot pattern and can emit light of other color may be quenched, so as to effectively improve or even completely eliminate the color mixing problem, and facilitate increasing the display color gamut of the display panel.

In the embodiments of the present disclosure, the specific structure of the cross-linkable ligand is not particularly limited. In some embodiments, the cross-linkable ligand includes a coordinating group, a carbon chain, and a cross-linkable functional group, both of the coordinating group and the cross-linkable functional group are located on the carbon chain, and the coordinating group is attached to the quantum dot body by a coordination bond. Through the crosslinking of the cross-linkable functional groups, carbon chains in the cross-linkable ligands can form a network structure.

In the embodiment of the present disclosure, how to implementation the "local crosslinking process" in step S1022 is not particularly limited. The specific embodiment of the "local crosslinking process" may be determined according to the characteristics of the cross-linkable functional group. In the manufacturing process of the display panel, a photolithography process is mostly used. In the present disclosure, the cross-linkable functional group is a functional group that can be cross-linked by light irradiation. That is, the cross-linkable ligand is a photo cross-linkable ligand.

Figure 4:
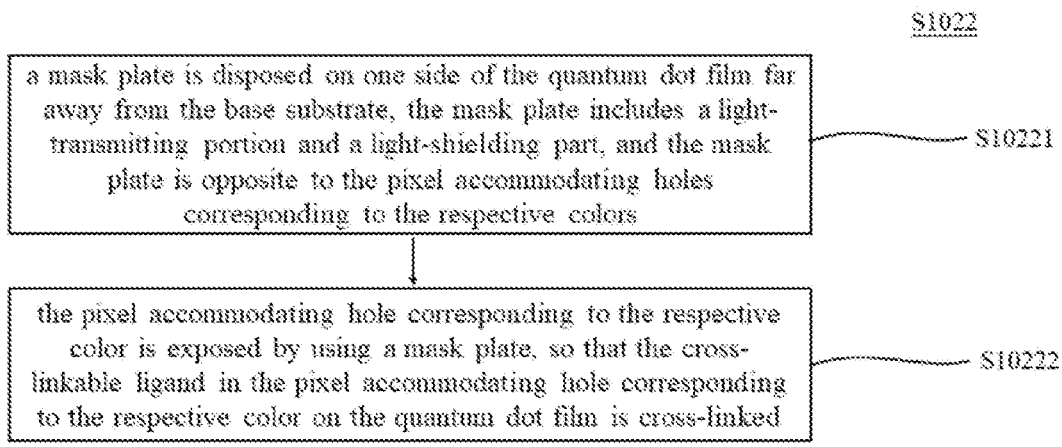
FIG. 4 is a flowchart of an optional method for implementing step S1022 according to an embodiment of the present disclosure.

FIG. 4 is a flowchart of an optional method for implementing step S1022 in the embodiment of the present disclosure. As shown in FIG. 4, in some embodiments, step S1022 includes the following steps S10221 and S10222.

At step S10221, a mask plate is disposed on one side of the quantum dot film far away from the base substrate, the mask plate includes a light-transmitting portion and a light-shielding part, and the mask plate is opposite to the pixel accommodating holes corresponding to a respective color.

At step S10222, the pixel accommodating holes corresponding to a respective color are exposed by using a mask plate, so that the cross-linkable ligands in the pixel accommodating holes corresponding to the respective color on the quantum dot film are cross-linked.

As one example, in manufacturing the first quantum dot pattern capable of emitting red light shown in FIG. 4, the light-transmitting portion of a mask plate may be aligned with a pixel accommodating hole corresponding to the red sub-pixel region, and light may be irradiated to the pixel accommodating hole corresponding to the red sub-pixel region through the light-transmitting portion of the mask plate using an exposure apparatus, so that cross-linkable functional groups of the red quantum dot located in the pixel accommodating hole corresponding to the red sub-pixel region.

In the present disclosure, the wavelength of the light used in the exposure process in step S10222 is not particularly limited, and may be set according to the specific type of the cross-linkable ligand. For example, when the cross-linkable functional group in the cross-linkable ligand is an ultraviolet curing functional group, the step S10222 may be performed using ultraviolet rays.

In the present disclosure, specific types and specific numbers of the cross-linkable functional groups configured for one quantum dot body are not particularly limited, and optionally, the cross-linkable functional groups include at least one of the following functional groups: double bond, epoxy group, carboxyl group, sulfydryl group, amino group and hydroxyl group.

Figure 5:
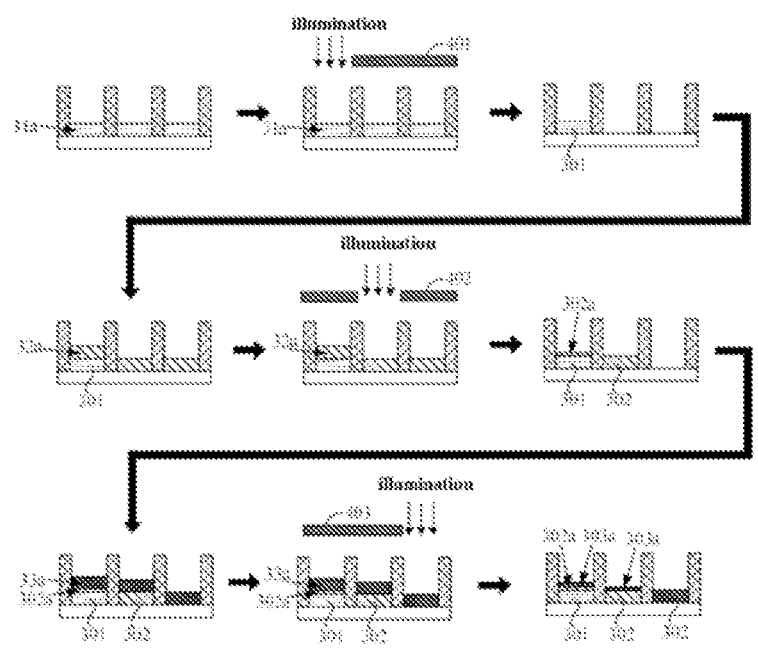
FIG. 5 is a process flow diagram of manufacturing a first red quantum dot pattern, a first green quantum dot pattern, and a first blue quantum dot pattern by a photolithography process according to an embodiment of the present disclosure.

FIG. 5 is a flow chart of a process of manufacturing three kinds of first quantum dot patterns capable of respectively emitting red, green and blue light by photolithography process according to the embodiment of the present disclosure. As shown in FIG. 5, a sequence of firstly manufacturing the first quantum dot pattern 301 capable of emitting red light, then manufacturing the first quantum dot pattern 302 capable of emitting green light, and finally manufacturing the first quantum dot pattern 303 capable of emitting blue light is taken as an example.

The process of manufacturing the first quantum dot pattern 301 capable of emitting red light includes: firstly, forming a red quantum dot film 31a capable of emitting red light; then, performing an exposure process on a portion of the red quantum dot film 31a, which is positioned in the pixel accommodating hole corresponding to the red sub-pixel region, by using a corresponding mask plate 401; finally, performing a developing process on the red quantum dot film 31a after the exposure process to form the first quantum dot pattern 301 capable of emitting red light in the pixel accommodating hole corresponding to the red sub-pixel region.

The process of manufacturing the first quantum dot pattern 302 capable of emitting green light includes: firstly, forming a green quantum dot film 32a capable of emitting green light; then, performing an exposure process on a portion of the green quantum dot film 32a, which is positioned in the pixel accommodating hole corresponding to the green sub-pixel region by using the corresponding mask plate 402; finally, performing a developing process on the green quantum dot film 32a after the exposure process to form a first quantum dot pattern 302 capable of emitting green light in the pixel accommodating hole corresponding to the green sub-pixel region. At this time, the green quantum dots 302a remain on the surface of the first quantum dot pattern 301 capable of emitting red light.

The process of manufacturing the first quantum dot pattern capable of emitting blue light includes: firstly, forming a blue quantum dot film 33a capable of emitting blue light; then, performing an exposure process on a portion of the blue quantum dot film 33a, which is positioned in the pixel accommodating hole corresponding to the blue sub-pixel region, by using the corresponding mask plate 403; finally, performing a developing process is performed on the blue quantum dot film 33a after the exposure process to form a first quantum dot pattern 303 capable of emitting blue light in the pixel accommodating hole corresponding to the blue sub-pixel region. At this time, green quantum dots 302a and blue quantum dots 303a remain on the surface of the first quantum dot pattern 301 capable of emitting red light, and blue quantum dots 303a remain on the surface of the first quantum dot pattern 302 capable of emitting green light.

Figure 6:
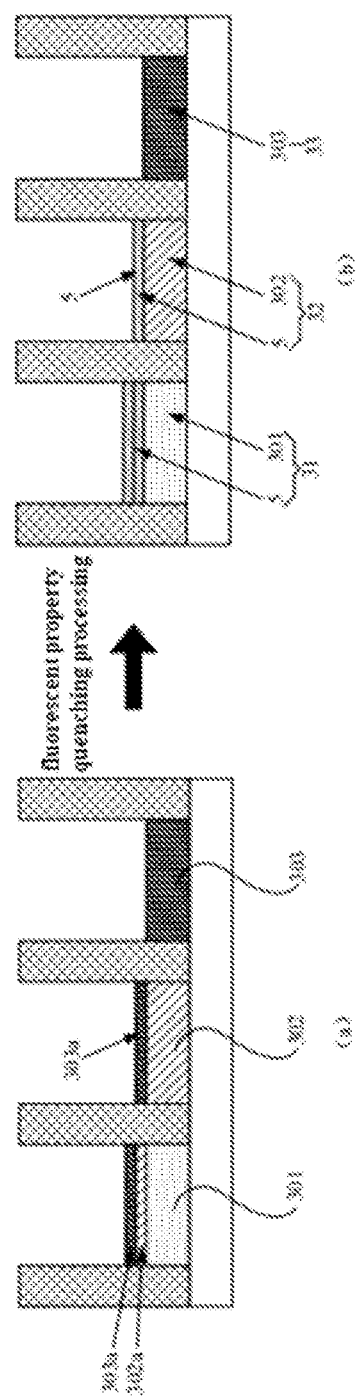
FIG. 6 is a schematic diagram of a fluorescence property quenching processing performed in an embodiment of the present disclosure.

FIG. 6 is a schematic diagram of a fluorescent property quenching process performed in the embodiment of the disclosure. As shown in FIG. 6, as an optional embodiment, the display panel is divided into a red sub-pixel region, a green sub-pixel region and a blue sub-pixel region, and a step S102a is performed to form a first quantum dot pattern 301 capable of emitting red light in the red sub-pixel region, a first quantum dot pattern 302 capable of emitting green light in the green sub-pixel region, and a first quantum dot pattern 303 capable of emitting blue light in the blue sub-pixel region, respectively.

Taking an example of a sequence of firstly manufacturing a first quantum dot pattern 301 capable of emitting red light, then manufacturing a first quantum dot pattern 302 capable of emitting green light, and finally manufacturing a first quantum dot pattern 303 capable of emitting blue light, the display panel obtained at this time is as shown in part (a) of FIG. 6. The green quantum dots 302a capable of emitting green light and the blue quantum dots 303a capable of emitting blue light remain on the surface of the first quantum dot pattern 301 capable of emitting red light obtained by the step S102, and the blue quantum dots 303a capable of emitting blue light remain on the surface of the obtained first quantum dot pattern 302 capable of emitting green light.

Referring to part (b) of FIG. 6, through the fluorescence property quenching process in step S102b, fluorescence property quenching may occur in both the green quantum dots 302a capable of emitting green light and the blue quantum dots 303a capable of emitting blue light, which remain on the surface of the first quantum dot pattern 301 capable of emitting red light, to form the second quantum dot pattern 5. Meanwhile, the blue quantum dots 303a capable of emitting blue light, which remain on the surface of the first quantum dot pattern 302 capable of emitting green light also undergo quenching of fluorescent properties to form the second quantum dot pattern 5.

As can be seen from FIG. 6, the quantum dot pattern element 31 capable of emitting red light in the red sub-pixel region includes the first quantum dot pattern 301 and the second quantum dot pattern 5 which are sequentially stacked. The quantum dot pattern element 32 capable of emitting green light in the green sub-pixel region includes the first quantum dot pattern 302 and the second quantum dot pattern 5 which are sequentially stacked, and the quantum dot pattern element 33 capable of emitting blue light in the blue sub-pixel region includes only the first quantum dot pattern 303 and does not include the second quantum dot pattern 5.

Based on the above, in the embodiment of the present disclosure, after the step S102a is completed, there are no quantum dots that are not subjected to the cross-linking processing above the finally manufactured first quantum dot pattern, and thus when the process of step S102b is performed, quenching of fluorescence property of the quantum dot body does not occur in the pixel accommodating hole where the finally manufactured first quantum dot pattern is located. That is, after the step S102b is completed, there is no second quantum dot pattern over one of the finally manufactured first quantum dot patterns in step S102a. That is, the first quantum dot pattern and the second quantum dot pattern which are sequentially stacked are present in only some of the quantum dot pattern elements on the display panel, and in the remaining of the quantum dot pattern elements, there is only the first quantum dot pattern and no second quantum dot pattern.

Figure 7:
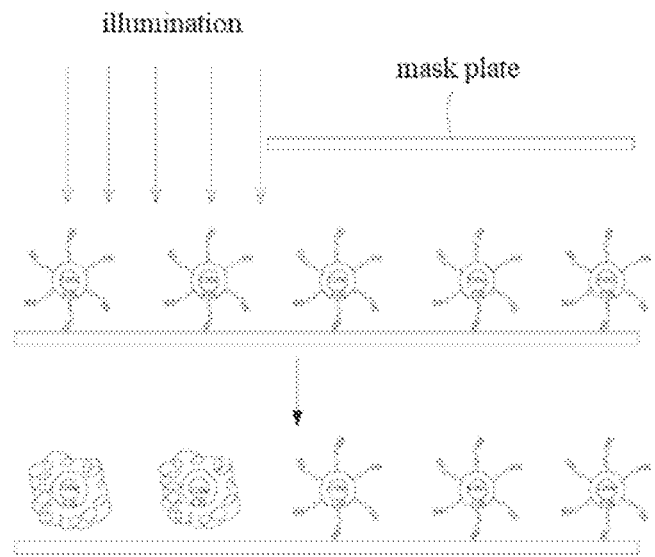
FIG. 7 is a schematic diagram of quantum dots in which cross-linkable ligands are crosslinked to form a network structure, according to an embodiment of the disclosure.

FIG. 7 is a schematic view of quantum dots, in which cross-linkable ligands are cross-linked to form a network structure, according to the embodiment of the present disclosure. As shown in FIG. 7, the network structure formed by cross-linking of the cross-linkable ligands is located on an outer surface of the quantum dot body, and can surround and cover the quantum dot body. The network structure can protect the quantum dot bodies when step S102b is executed, and can effectively prevent the quenching of the fluorescence property of the quantum dot bodies in the first quantum dot pattern, of which a detailed description will be given below.

In the present disclosure, the implementation of the step S102b is not particularly limited. As an optional implementation, the step S102b may specifically include step S102b1.

At step S102b1, an ion exchange processing is performed, by using a processing solution containing metal cations, on the quantum dot bodies in the quantum dots which are not subjected to the cross-linking process and are located on the surface of the first quantum dot pattern.

The quantum dot body has a core-shell structure, and in the quantum dot body not subjected to the cation exchange processing, the material of the quantum dot shell and the material of the quantum dot core both have cations. For example, for a red quantum dot capable of emitting red light, CdSe/CdS, the quantum dot core of the red quantum dot is made of CdSe, and the cation therein is $Cd^{2+}$; the quantum dot shell of the red quantum dot is made of CdS, and the cation therein is also $Cd^{2+}$. If the cation $Cd^{2+}$ in the quantum dot core and/or quantum dot shell is replaced by another metal cation, the structure obtained after replacement is a core-shell structure that does not have fluorescence properties.

It should be noted that the fluorescence will be quenched as long as at least one of the quantum dot core of the quantum dot body and the quantum dot shell of the quantum dot body undergoes the cation exchange. In other words, after the quantum dot body remaining on the surface of the first quantum dot pattern and not subjected to the cross-linking processing is subjected to the ion exchange processing using the solution having the metal cations, the cations of the quantum dot shell of the quantum dot body are replaced by the corresponding metal cations, and/or the cations of the quantum dot core of the quantum dot body are replaced by the corresponding metal cations.

Figure 8:
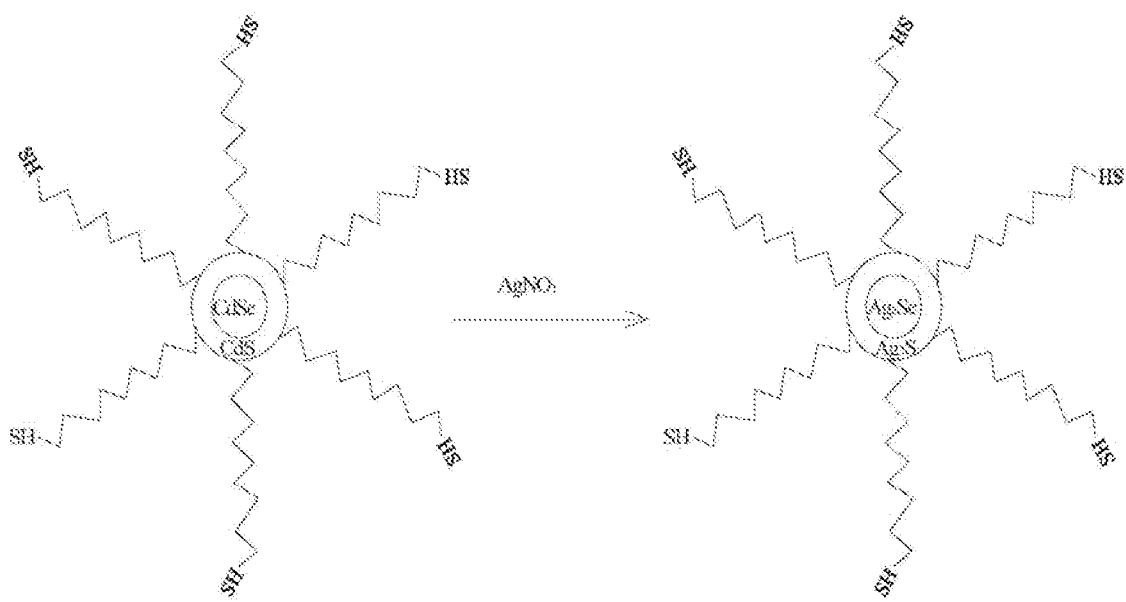
FIG. 8 is a schematic diagram of a chemical reaction for quenching the fluorescence property of quantum dots CdSe/CdS by using silver ions in a silver nitrate methanol mixed solution.

FIG. 8 is a chemical reaction schematic diagram of quenching the fluorescence property of the quantum dot CdSe/CdS by using silver ions in a mixed solution of silver nitrate and methanol. As shown in FIG. 8, after a cation $Cd^{2+}$ in the quantum dot core CdSe and a cation $Cd^{2+}$ in the quantum dot shell CdS are both replaced by $Ag^+$, the core-shell structure without fluorescence property, $Ag_2Se/Ag_2S$, is obtained, i.e., the fluorescence property of the quantum dot material is quenched.

It should be noted that, in the process of performing fluorescence property quenching processing by using a processing solution with metal cations, since the non-cross-linked cross-linkable ligand remaining in the quantum dot on the surface of the first quantum dot pattern cannot protect the quantum dot body, the quantum dot body can undergo cation exchange with the processing solution, so that the fluorescence property of the quantum dot body is quenched. However, in the first quantum dot pattern, the quantum dot body can be protected by a network structure formed by crosslinking the cross-linkable ligand, and metal cations in the processing solution cannot penetrate through the network structure, thereby ensuring that the quantum dot body surrounded by the network structure does not undergo cation exchange, and the fluorescence property of the quantum dot body will not be quenched.

In some embodiments, the step of performing an ion exchange processing on the quantum dot body in the quantum dot, which is located on the surface of the first quantum dot pattern and is not subjected to the cross-linking processing, using a processing solution having metal cations includes: immersing the display panel in a processing solution having metal cations, where the concentration of the metal cations in the processing solution is 0.05 mol/L to 0.15 mol/L, and the immersion time is 5 min to 15 min. In practical applications, the concentration of the metal cations and the immersion time in the processing solution can be designed and adjusted according to actual needs.

After the display panel is immersed, the surface of the display panel is washed by a solvent to remove residual metal cations on the surface of the display panel, and then dried.

In the embodiment of the disclosure, the metal cation used in step S102b1 is not limited. In some embodiments, the metal cation is selected from at least one of the following cations: $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, $Pb^{2+}$.

Figure 9:
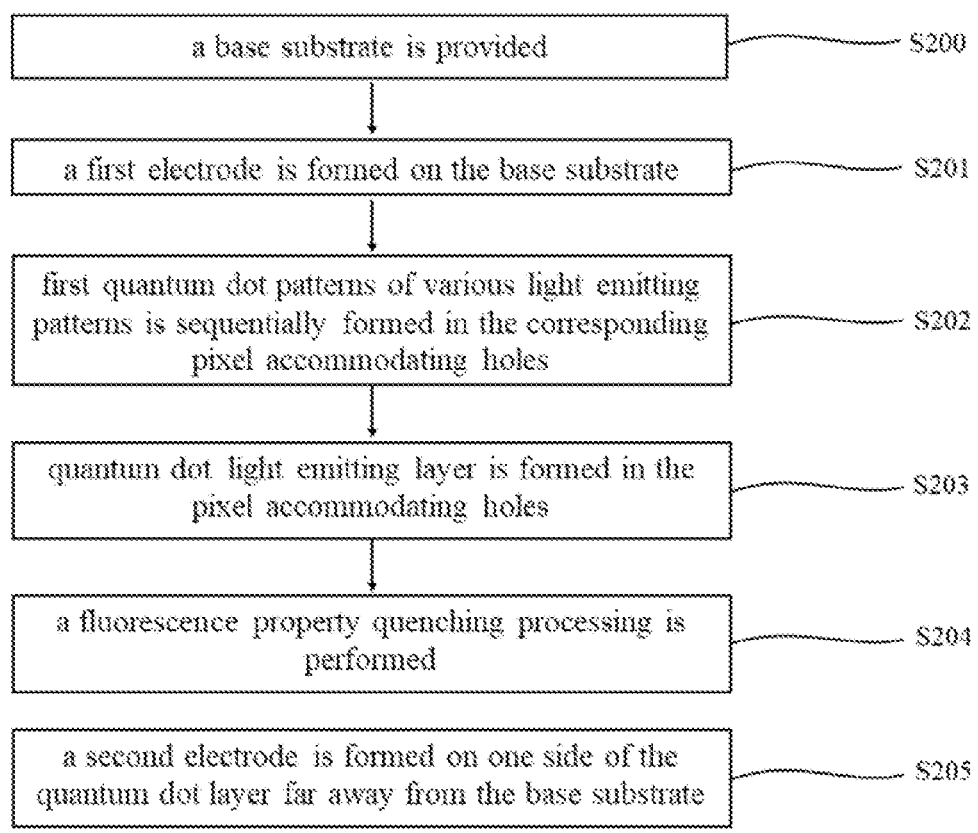
FIG. 9 is a flowchart of another method for manufacturing a display panel according to an embodiment of the present disclosure.

FIG. 9 is a flowchart of another manufacturing method of a display panel according to an embodiment of the disclosure, and as shown in FIG. 9, the manufacturing method includes the following steps S200 to S205.

At step S200, a base substrate is provided.

At step S201, a first electrode is formed on the base substrate.

At step S202, a pixel defining layer is formed on one side of the first electrode far away from the base substrate, and a plurality of pixel accommodating holes are formed in the pixel defining layer.

At step S203, first quantum dot patterns of various light emitting patterns is sequentially formed in the corresponding pixel accommodating holes.

At step S204, a fluorescence property quenching processing is performed to obtain final structures of various light emitting patterns.

For the specific description of step S202 to step S204, the descriptions thereof are similar to the description of step S101 to step S102b in the foregoing embodiment, and details will not be repeated here.

At step S205, a second electrode is formed on one side of the quantum dot layer far away from the base substrate.

In an embodiment of the disclosure, each first quantum dot pattern, and the first electrode and the second electrode directly facing the first quantum dot pattern constitute one quantum dot light emitting diode (QLED). One of the first electrode and the second electrode may be a cathode and the other may be an anode. At this time, the manufactured display panel can be a quantum dot light emitting diode display panel.

In some embodiments, the cathode may be a planar electrode, the anode may be a bulk electrode, all the quantum dot light emitting diodes in the display panel share the same cathode, the bulk electrodes correspond to the first quantum dot patterns one to one, and different bulk electrodes are disposed at intervals.

In the embodiment of the present disclosure, the quantum dot light emitting diode on the display panel may be an upright type light emitting device or an inverted type light emitting device. For the upright type light emitting device, the anode is closer to the base substrate than the cathode (i.e., the first electrode is the anode and the second electrode is the cathode). For the inverted type light emitting device, the cathode is closer to the base substrate than the anode (i.e., the first electrode is a cathode and the second electrode is an anode). The quantum dot light emitting diode may be a top emission type light emitting device or a bottom emission type light emitting device no matter whether the quantum dot light emitting diode is an upright type light emitting device or an inverted type light emitting device. When the quantum dot light emitting diode is an upright top emission type light emitting device, the anode is a reflection electrode and the cathode is a transmission electrode. When the quantum dot light emitting diode is an upright bottom emission type light emitting device, the anode is a transmission electrode, and the cathode is a reflection electrode. When the quantum dot light emitting diode is an inverted top emission type light emitting device, the anode is a transmission electrode, and the cathode is a reflection electrode. When the quantum dot light emitting diode is an inverted bottom emission type light emitting device, the anode is a reflection electrode and the cathode is a transmission electrode.

With the continuous optimization of the performance of the light emitting device, the light emitting device not only includes an anode layer, a cathode layer and a light emitting layer, but also includes a hole injection layer (HIL) and a hole transport layer (HTL) disposed between the anode layer and the light emitting layer, and an electron transport layer (ETL) disposed between the light emitting layer and the cathode layer. Of course, an electron injection layer (EIL) may be further disposed between the electron transport layer and the cathode layer.

Figure 10:
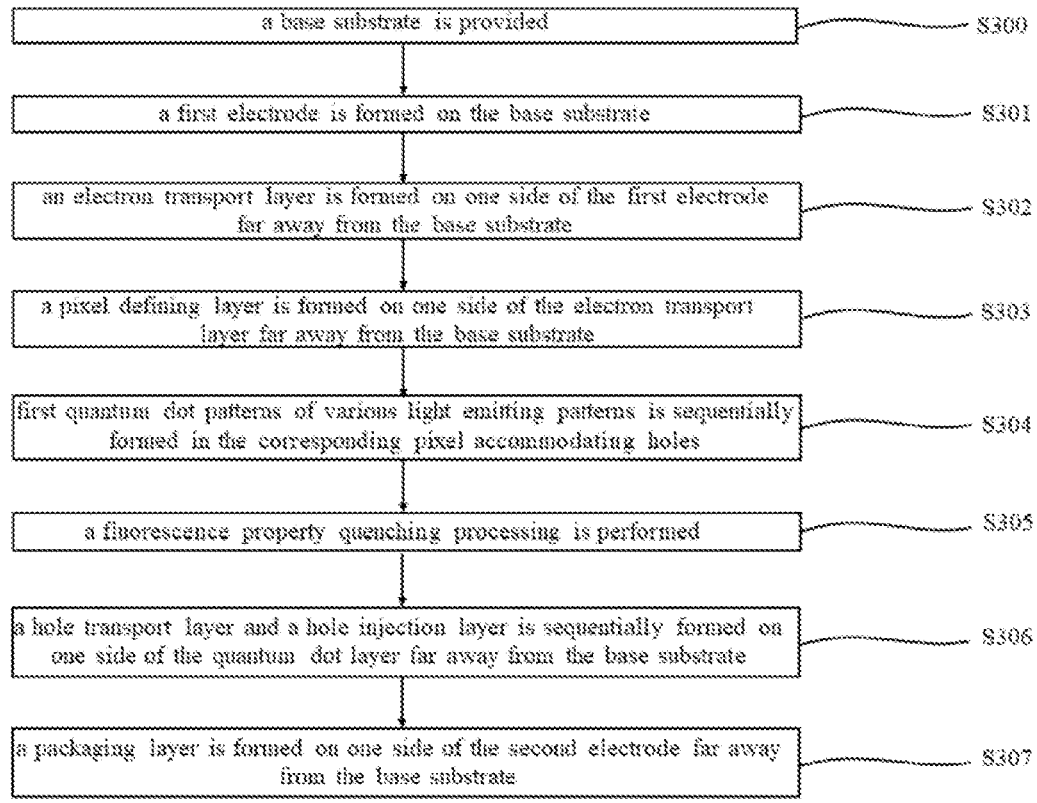
FIG. 10 is a flowchart of yet another method for manufacturing a display panel according to an embodiment of the present disclosure.

FIG. 10 is a flowchart of still another manufacturing method of a display panel according to an embodiment of the present disclosure. As shown in FIG. 10, taking a case where a quantum dot light emitting diode in the display panel is an inverted bottom emission type light emitting device as an example, the manufacturing method includes the following steps S300 to S307.

At step S300, a base substrate is provided.

At step S301, a first electrode is formed on one side of the base substrate.

The first electrode is used as a cathode, and the first electrode can be a planar electrode, and the material of the first electrode may be a transparent conductive material, such as fluorine-doped tin oxide (FTO), indium tin oxide (ITO), and the like.

At step S302, an electron transport layer is formed on one side of the first electrode far away from the base substrate.

In the embodiments of the present disclosure, the material of the electron transport layer is not particularly limited. For example, the electron transport layer may be made using zinc oxide (ZnO). Of course, the present disclosure is not limited thereto, and in the embodiments of the present disclosure, at least one of magnesium zinc oxide, aluminum zinc oxide and magnesium aluminum zinc oxide may also be used for the electron transport layer.

Take a case where the electron transport layer is a zinc oxide nano-particle film as an example. The colloid containing zinc oxide nano-particles can be spin-coated on the surface of the first electrode, and then heated at the process temperature of 80° C. to 120° C. to form a film. In the spin coating process, the rotating speed of the spin coater can be set within the range of 500 rpm to 2500 rpm so as to adjust the thickness of the film layer.

Take a case where the electron transport layer is made of zinc oxide and manufactured by a solution method as an example. Firstly, 1 g of zinc acetate (or zinc nitrate and the like) is dissolved in 5 mL of mixed solution of ethanolamine and n-butyl alcohol to form a zinc precursor solution. Then, a certain amount (90 μL to 120 μL) of zinc precursor solution is spin-coated on the surface of the first electrode through the spin coater, and the rotating speed may be about 2000 rpm. Then, the product is placed on a hot table at the temperature of 250° C. to 300° C. for heating and annealing, and the zinc acetate/zinc nitrate is decomposed at high temperature to form a zinc oxide film, so that the electron transport layer is manufactured.

In some embodiments, a step of forming an electron injection layer is further included between step S301 and step S302. The material of the electron injection layer includes, but is not limited to, any one of lithium fluoride, sodium fluoride, potassium fluoride, rubidium fluoride, cesium fluoride, lithium oxide, and lithium metaborate.

At step S303, a pixel defining layer is formed on one side of the electron transport layer far away from the base substrate.

A plurality of pixel accommodating holes in one-to-one correspondence with the sub-pixel regions are formed in the pixel defining layer. The pixel defining layer can be made of a material with a light shielding function or a reflection function so as to prevent crosstalk caused by light emitted between different first quantum dot patterns. After the pixel defining layer is formed, the base substrate formed with the pixel defining layer may be cleaned three times sequentially with the use of water, ethanol, and acetone, and the display panel may be irradiated with ultraviolet ozone for 10 minutes to remove organic residues on the surface.

At step S304, a first quantum dot pattern of each quantum dot pattern element is sequentially formed.

At step S305, a fluorescence property quenching process is performed.

A quantum dot layer may be manufactured by steps S304 and S305. For the specific description of step S304 and step S305, the descriptions thereof may be similar to the related description of step S102a and step S102b in the foregoing embodiment, and details will not be repeated here.

At step S306, a hole transport layer and a hole injection layer is sequentially formed on one side of the quantum dot layer far away from the base substrate.

The material of the hole injection layer includes, but is not limited to, poly (3, 4-ethylenedioxythiophene) polystyrene sulfonate (PEDOT:PSS), polythiophene, polyaniline, polypyrrole, and copper phthalocyanine.

Materials for the hole transport layer include, but are not limited to, p-type polymer materials and various p-type low molecular weight materials, for example, polythiophene, polyaniline, polypyrrole, a mixture of poly-3, 4-ethylenedioxythiophene and poly (sodium p-styrenesulfonate), 4,4'cyclohexylidenebis[N,N-bis(4-methylphenyl)aniline (TAPC), or 4,4',4"-tris(N-carbazolyl)triphenylamine (TCTA), N,N'-di(1-naphthyl)-N,N'-diphenylbenzidine (NPB).

At step S307, an encapsulation layer is formed on one side of the second electrode far away from the base substrate.

The encapsulation layer can be an encapsulation cover plate, the encapsulation cover plate and the second electrode may be fixed through ultraviolet curing glue, and the ultraviolet curing glue may also be used for encapsulation.

Figure 11A:
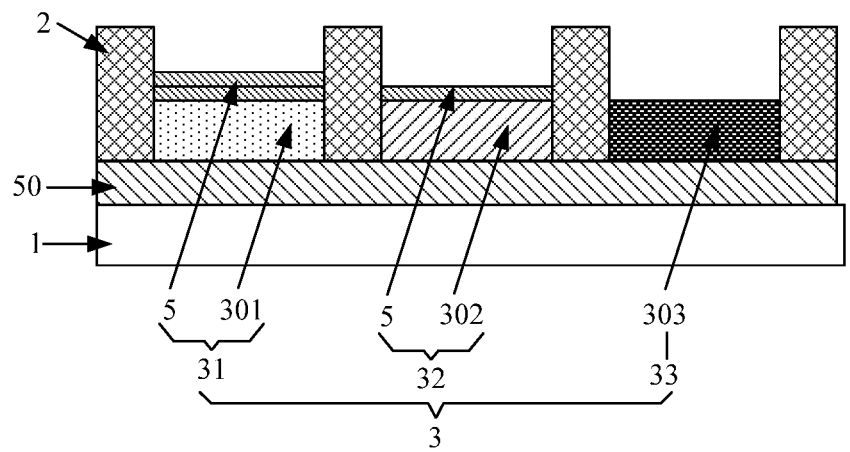
FIG. 11a is a schematic cross-sectional view of a display panel according to an embodiment of the disclosure.

Based on the same inventive concept, the embodiment of the present disclosure further provides a display panel, and the display panel may be manufactured by the manufacturing method provided in the above embodiment. The exemplary descriptions are given below with reference to the accompanying drawings. FIG. 11 a is a schematic cross-sectional view of a display panel according to an embodiment of the disclosure. As shown in FIG. 11a, the display panel includes a base substrate 1, a pixel defining layer 2, and a quantum dot layer 3.

The pixel defining layer 2 includes a plurality of pixel accommodating holes. The quantum dot layer 3 includes at least two quantum dot pattern elements 31, 32, 33 capable of emitting light of different colors (the quantum dot pattern element 31 capable of emitting red light, the quantum dot pattern element 32 capable of emitting green light, and the quantum dot pattern element 33 capable of emitting blue light are exemplarily illustrated in the drawings), and the quantum dot pattern elements 31, 32, 33 are in one-to-one correspondence with the pixel accommodating holes and are located in the corresponding pixel accommodating holes.

Some of the quantum dot patterns 301 and 302 include first quantum dot patterns 301 and 302 and a second quantum dot pattern 5 which are stacked, the second quantum dot pattern 5 is located on one side of the first quantum dot patterns 301 and 302 far away from the base substrate 1, the materials of the first quantum dot patterns 301 and 302 include quantum dot bodies with fluorescence property and a cross-linking structure, and the materials of the second quantum dot pattern 5 include quantum dot bodies with fluorescence property quenching and the uncrosslinked cross-linkable ligand.

In some embodiments, first quantum dot patterns 301, 302 are in direct contact with corresponding second quantum dot patterns 5.

In some embodiments, the cross-linked structure is a cross-linked network structure.

As described above, after the first quantum dot patterns 301, 302, 303 of the various quantum dot pattern elements 31, 32, 33 are manufactured, the fluorescence property quenching processing is performed to quench the fluorescence property of the quantum dot bodies in the quantum dots which are located on the surfaces of the first quantum dot patterns 301, 302, 303 and are not subjected to the cross-linking processing, thereby forming a second quantum dot pattern 5, which can effectively improve or even completely eliminate the color mixing problem, and is beneficial to improving the display color gamut of the display panel.

It should be noted that, the quantum dot pattern element 31 capable of emitting red light shown in the drawings includes the first quantum dot pattern 301 and the second quantum dot pattern 5 which are sequentially stacked, the quantum dot pattern element 32 capable of emitting green light includes the first quantum dot pattern 302 and the second quantum dot pattern 5 which are sequentially stacked, and the quantum dot pattern element 33 capable of emitting blue light includes only the first quantum pattern and does not include the second quantum dot pattern 5, which is only an exemplary case and does not limit the technical solution of the present disclosure.

As described above, the fluorescence properties of the quantum dot bodies in the quantum dots which are located on the surface of the first quantum dot patterns 301, 302, 303 and are not subjected to the cross-linking processing may be quenched by ion exchange to form the second quantum dot pattern 2. During ion exchange, cations in the quantum dot core of the quantum dot body, cations in the quantum dot shell of the quantum dot body, or cations in both the quantum dot core and the quantum dot shell of the quantum dot body may be replaced. That is, in the formed second quantum dot pattern 5, the cations in the quantum dot core and the cations in the quantum dot shell in the quantum dot body may be the same or different.

In some embodiments, within the second quantum dot pattern 5, the material of the quantum dot core in quantum dot body with the quenched fluorescent property and/or the material of the quantum dot shell in the quantum dot body with the quenched fluorescent property includes at least one of the following cations: $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, $Pb^{2+}$.

In some embodiments, the display panel includes a color conversion layer, which is a quantum dot layer 3, and a light source 50. The light source may emit light of a predetermined color, and the quantum dot pattern elements 31, 32, 33 in the quantum dot layer 3 may emit light of other colors by being excited by the light of the predetermined color. The light source 50 may be an OLED, a MicroLED, or the like.

Figure 11B:
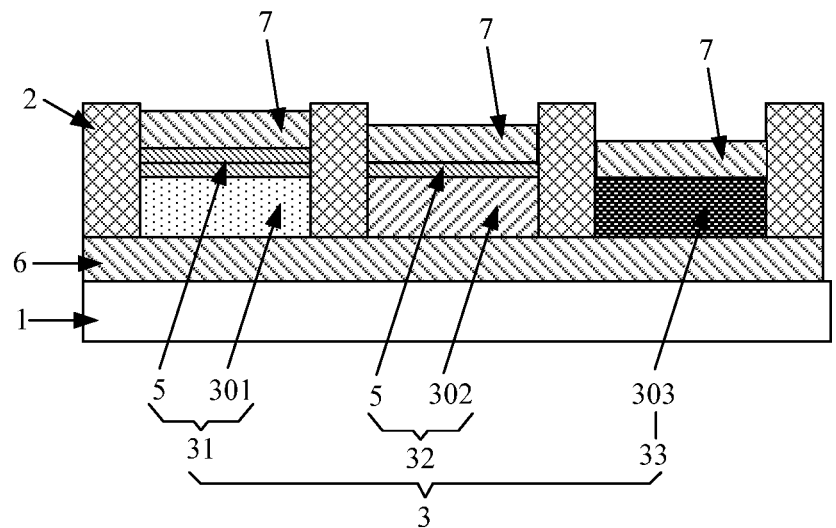
FIG. 11b is another schematic cross-sectional view of a display panel according to an embodiment of the disclosure.

FIG. 11b is another schematic cross-sectional view of the display panel according to the embodiment of the disclosure. As shown in FIG. 11b, unlike the quantum dot pattern element shown in FIG. 11a that is made to emit light by using a "light excitation" method, the quantum dot pattern element is made to emit light by using an "electric excitation" method in FIG. 11b. Specifically, the display panel is a quantum dot light emitting diode display panel, and the display panel further includes a first electrode 6 located between the base substrate 1 and the quantum dot layer 3, and a second electrode 7 located on one side of the quantum dot layer 3 far away from the base substrate 1. One of the first electrode 6 and the second electrode 7 is an anode, and the other is a cathode. Each first quantum dot pattern, and the first electrode and the second electrode directly facing the first quantum dot pattern constitute one quantum dot light emitting diode (QLED).

Figure 12:
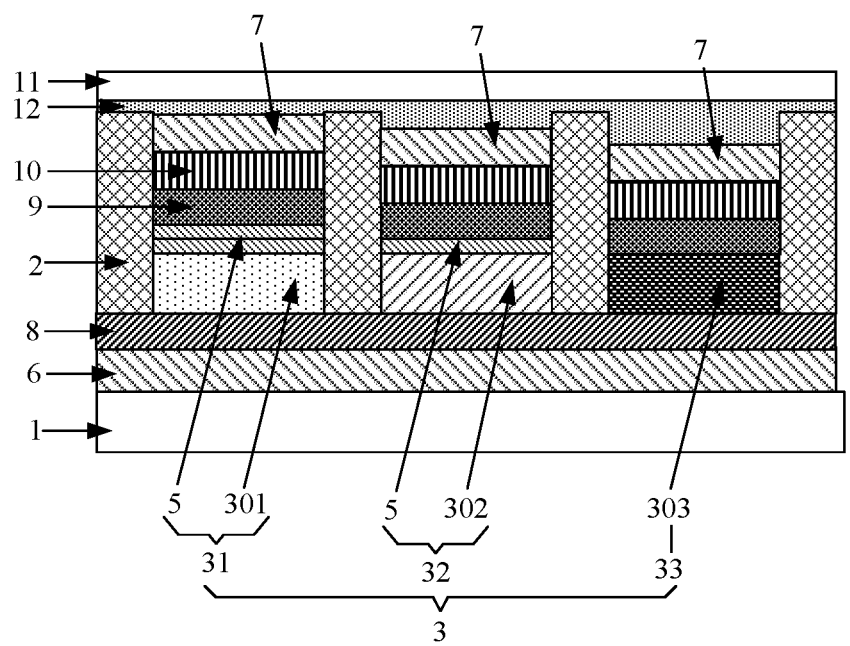
FIG. 12 is another schematic cross-sectional view of a display panel according to an embodiment of the disclosure.

FIG. 12 is a schematic cross-sectional view of a display panel according to an embodiment of the disclosure. As shown in FIG. 12, the display panel not only includes a base substrate 1, a first electrode 6, a pixel defining layer 2, a quantum dot layer 3, and a second electrode 7 in FIG. 11b, but also includes an electron transport layer 8, a hole transport layer 9 and a hole injection layer 10.

In some embodiments, the first electrode 6 is a cathode and the second electrode 7 is an anode. The electron transport layer 8 is located between the first electrode 6 and the quantum dot layer 3. The hole transport layer 9 is positioned between the quantum dot layer 3 and the second electrode 7. The hole injection layer 10 is located between the hole transport layer 9 and the second electrode 7.

In some embodiments, an electron injection layer (not shown) is further disposed between the first electrode 6 and the electron transport layer 8.

For the specific description of the electron transport layer 8, the hole transport layer 9 and the hole injection layer 10 in this embodiment, the descriptions thereof may be similar to the descriptions of the foregoing embodiments, and details will not be repeated here.

In some embodiments, the display device may further include an encapsulation layer 11, which may specifically be an encapsulation cover plate. The encapsulation cover plate and the second electrode 7 may be fixed by ultraviolet curing glue 12, and the ultraviolet curing glue 12 may also be used for encapsulation.

Based on the same inventive concept, the embodiment of the present disclosure further provides a display device, which includes a display panel provided by the foregoing embodiment.

The display device according to the embodiment of the disclosure may be any product or component with a display function, such as a mobile phone, a tablet computer, a television, a display, a notebook computer, a digital photo frame, a navigator or the like.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the disclosure, and such modifications and improvements are also considered to be within the scope of the disclosure.

What is claimed is:

1. A method for manufacturing a display panel, comprising:
   providing a base substrate;
   forming a pixel defining layer on one side of the base substrate, the pixel defining layer comprising a plurality of pixel accommodating holes;
   forming a quantum dot layer, the quantum dot layer comprising at least two quantum dot pattern elements capable of emitting light with different colors, and a first quantum dot pattern being in one-to-one correspondence with the plurality of pixel accommodating holes and positioned in a corresponding one of the pixel accommodating holes;
   wherein the forming of the quantum dot layer comprises sequentially forming the first quantum dot pattern of the at least two quantum dot pattern elements, and the forming of the first quantum dot pattern of one of the at least two quantum dot pattern elements comprises:
   forming a quantum dot film capable of emitting light of a corresponding color, the quantum dot film comprising quantum dot bodies and cross-linkable ligands, performing a local cross-linking process on the quantum dot film such that cross-linkable ligands of the quantum dot film positioned in the pixel accommodating holes corresponding to the corresponding color are cross-linked, and
   performing a developing process on the quantum dot film subjected to the local cross-linking process so as to form the first quantum dot pattern in the pixel accommodating holes corresponding to the corresponding color;
   wherein after the sequentially forming the first quantum dot pattern of the at least two quantum dot pattern elements, the method further comprises:
   performing fluorescence property quenching process such that a fluorescence property of a quantum dot body in a quantum dot which is positioned on a surface of the first quantum dot pattern and not subjected to the cross-linking process is quenched to form the at least two quantum dot pattern elements, wherein a part of the quantum dot pattern elements comprises the first quantum dot pattern and a second quantum dot pattern which are stacked, the second quantum dot pattern is positioned on a side of the first quantum dot pattern far away from the base substrate, the first quantum dot pattern comprises the quantum dot body with fluorescence property and a crosslinking structure, and the second quantum dot pattern comprises a quantum dot body with fluorescence property quenching and uncross-linked cross-linkable ligands.

2. The method according to claim 1, wherein the performing of the fluorescence property quenching process comprises:
   performing, by using a processing solution with metal cations, an ion exchange process on the quantum dot body in the quantum dot which is positioned on the surface of the first quantum dot pattern and is not subjected to the cross-linking process.

3. The method according to claim 2, wherein the performing of the ion exchange process on the quantum dot body in the quantum dot which is positioned on the surface of the first quantum dot pattern and is not subjected to the cross-linking processing by using the processing solution with metal cations, comprises:
   immersing the display panel in the processing solution with metal cations, wherein a concentration of the metal cations in the processing solution is 0.05 mol/L to 0.15 mol/L, and an immersion time is 5 min to 15 min.

4. The method according to claim 2, wherein the metal cations are selected from at least one of $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$ and $Pb^{2+}$.

5. The method according to claims 1, wherein the cross-linkable ligands are photo cross-linkable ligands, and the performing of the local cross-linking process on the quantum dot film comprises:
   disposing a mask plate on one side of the quantum dot film far away from the base substrate, wherein the mask plate comprises a light-transmitting portion and a light-shielding portion, and the mask plate directly faces the pixel accommodating holes corresponding to the corresponding color; and exposing the pixel accommodating holes corresponding to the corresponding color by using the mask plate so as to enable the cross-linkable ligands positioned in the pixel accommodating holes corresponding to the corresponding color on the quantum dot film to be cross-linked.

6. The method according to claims 1, wherein during the local cross-linking process of the quantum dot film, the cross-linkable ligands after being cross-linked form a cross-linked network structure on the surface of the quantum dot body.

7. The method according to claims 1, wherein before the forming of the pixel defining layer on one side of the base substrate, the method further comprises forming a first electrode on the base substrate; and wherein after the forming of the quantum dot layer, the method further comprises forming a second electrode on one side of the quantum dot layer far away from the base substrate.

8. The method according to claim 7, wherein the first electrode is a cathode and the second electrode is an anode; and wherein after forming the first electrode and before forming the pixel defining layer, the method further comprises:

forming an electron transmission layer on one side of the first electrode far away from the base substrate.

9. The method according to claim 8, wherein after forming the quantum dot layer and before forming the second electrode, the method further comprises:

sequentially forming a hole transport layer and a hole injection layer on one side of the quantum dot layer far away from the base substrate.

10. The method according to claims 7, wherein after forming the second electrode, the method further comprises:

forming an encapsulation layer on one side of the second electrode far away from the base substrate.

11. A display panel, comprising:

a base substrate;

a pixel defining layer located on the base substrate and comprising a plurality of pixel accommodating holes;

a quantum dot layer comprising at least two quantum dot pattern elements capable of emitting light of different colors, the at least two quantum dot pattern elements being in one-to-one correspondence with the plurality of pixel accommodating holes and located in the corresponding pixel accommodating holes, wherein a part of the at least two quantum dot patterns comprise a first quantum dot pattern and a second quantum dot pattern which are stacked, the second quantum dot pattern is located on one side surface of the first quantum dot pattern far away from the base substrate, the first quantum dot pattern comprises a quantum dot body with fluorescence property and a cross-linking structure, and the second quantum dot pattern comprises a quantum dot body with fluorescence property quenching and an uncross-linked cross-linking ligand.

12. The display panel of claim 11, wherein the first quantum dot pattern is in direct contact with the second quantum dot pattern.

13. The display panel of claim 11, wherein a material of a quantum dot core in the quantum dot body with fluorescence property quenching and/or a material of a quantum dot shell in the quantum dot body with fluorescence property quenching comprises at least one of $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, $Pb^{2+}$.

14. The display panel according to claims 11, wherein the cross-linked structure is a cross-linked network structure.

15. The display panel according to claims 11, wherein the display panel is a quantum dot light emitting diode display panel, and the display panel further comprises:

a first electrode located between the base substrate and the quantum dot layer; and a second electrode positioned on one side of the quantum dot layer far away from the base substrate.

16. The display panel according to claim 15, wherein the first electrode is a cathode and the second electrode is an anode, and the display panel further comprises:

an electron transport layer between the first electrode and the quantum dot layer;

a hole transport layer between the quantum dot layer and the second electrode; and a hole injection layer between the hole transport layer and the second electrode.

17. The display panel of claim 11, wherein the display panel comprises a color conversion layer and a light source, the color conversion layer being the quantum dot layer.

18. A display device, comprising: the display panel according to claims 11.

19. The method according to claim 3, wherein the metal cations are selected from at least one of $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$ and $Pb^{2+}$.

20. The display panel of claim 12, wherein a material of a quantum dot core in the quantum dot body with fluorescence property quenching and/or a material of a quantum dot shell in the quantum dot body with fluorescence property quenching comprises at least one of $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, $Pb^{2+}$.

* * * * *